United States Patent [19]

Yonehara et al.

[11] Patent Number: 5,363,799
[45] Date of Patent: Nov. 15, 1994

[54] METHOD FOR GROWTH OF CRYSTAL

[75] Inventors: Takao Yonehara, Atsugi; Yuji Nishigaki, Odawara; Kenji Yamagata, Atsugi, all of Japan

[73] Assignee: Canon Kabushiki Kaisha, Tokyo, Japan

[21] Appl. No.: 979,376

[22] Filed: Nov. 19, 1992

Related U.S. Application Data

[63] Continuation of Ser. No. 670,527, Mar. 18, 1991, abandoned, which is a continuation of Ser. No. 228,608, Aug. 5, 1988, abandoned.

[30] Foreign Application Priority Data

Aug. 8, 1987 [JP] Japan .................... 62-198690

[51] Int. Cl.$^5$ ............................................. C30B 25/02
[52] U.S. Cl. ............................ 117/94; 117/106; 117/90; 117/7; 117/913
[58] Field of Search ............... 156/603, 610, 612, 613, 156/614, DIG. 67, DIG. 73, DIG. 98, DIG. 102

[56] References Cited

U.S. PATENT DOCUMENTS

| | | | |
|---|---|---|---|
| 3,585,088 | 6/1971 | Schwuttke et al. | 156/603 |
| 3,620,833 | 11/1971 | Gleim et al. | 156/614 |
| 3,634,143 | 1/1972 | Brennan | 156/603 |
| 3,655,439 | 4/1972 | Seiter | 156/603 |
| 4,147,584 | 4/1979 | Garrison et al. | 156/603 |
| 4,361,600 | 11/1982 | Brown | 156/603 |
| 4,448,632 | 5/1984 | Akasaka | 156/603 |

FOREIGN PATENT DOCUMENTS

| | | | |
|---|---|---|---|
| 58-69798 | 4/1983 | Japan | 156/603 |
| 59-152285 | 8/1984 | Japan | 156/603 |

OTHER PUBLICATIONS

Brice, "Crystal Growth Processes", John Wiley and Sons, Blackie and Sons, Bishopbriggs, Glasgow 1986 p. 249.

Smith et al, "Graphoepitaxy and Zone Melting Recrystallization of Patterned Films", Journal of Crystal Growth, vol. 63, 1983, pp. 535–537.

Primary Examiner—Robert Kunemund
Attorney, Agent, or Firm—Fitzpatrick, Cella, Harper & Scinto

[57] ABSTRACT

A method for growth of a crystal wherein a monocrystalline seed is arranged on a substrate and a monocrystal is permitted to grow with the seed as the originating point, comprises the step of:

(1) providing a substrate having a surface of smaller nucleation density;
(2) arranging on the surface of the substrate primary seeds having sufficiently fine surface area to be agglomerated;
(3) applying heat treatment to the primary seeds to cause agglomeration to occur, thereby forming a monocrystalline seed with a controlled face orientation; and
(4) applying crystal growth treatment to permit a monocrystal to grow with the monocrystalline seed as the originating point.

10 Claims, 3 Drawing Sheets

METHOD FOR GROWTH OF CRYSTAL

This application is a continuation of application Ser. No. 07/670,527, filed Mar. 18, 1991, now abandoned which, in turn, is a continuation of application Ser. No. 07/288,608 filed Aug. 5, 1988, now abandoned.

BACKGROUND OF THE INVENTION

1. Field of the Invention

This invention relates to a method for growth of a crystal, which is used for, for example, electronic devices such as semiconductor integrated circuits, optical integrated circuits, magnetic circuits, etc., optical devices, magnetic devices, piezoelectric devices, or surface acoustic devices, etc.

2. Related Background Art

In the prior art, a monocrystal of thin film to be used for semiconductor electronic devices or optical devices has been formed by epitaxial growth on a monocrystal substrate. For example, on a Si monocrystal substrate (silicon wafer), Si, Ge, GaAs, etc. have been known to be epitaxially grown from liquid phase, gas phase or solid phase, and also on a GaAs monocrystal substrate, a monocrystal such as GaAs, GaAlAs, etc. has been known to be epitaxially grown. By use of the semiconductor thin film thus formed, semiconductor devices and integrated circuits, emission devices such as semiconductor laser or LED, etc. are prepared.

Also, recently, ultra-high speed transistors by use of two-dimensional electron gas, ultra-lattice device, utilizing quantum well, etc. have been aggressively studied and developed. What has made these techniques possible is the high precision epitaxial technique such as MBE (molecular beam epitaxy by use of ultra-high vacuum) or MOCVD (metalloorganic chemical vapor depositon), etc.

In such epitaxial growth on a monocrystal substrate, it is necessary to adjust the lattice constants and coefficients of thermal expansion between the monocrystal material of the substrate and the epitaxial growth layer. If this adjustment is insufficient, lattice defects will be developed in the epitaxial layer. Also, the element constituting the substrate may be sometimes diffused into the epitaxial layer.

Thus, the method for forming a thin film monocrystal of the prior art by epitaxial growth can be understood to be greatly dependent on the substrate material. Mathews et al examined various combinations of substrate material and epitaxial growth layers (EPITAXIAL GROWTH, Academic Press, New York, 1975 ed. by J. W. Mathews).

The size of the substrate is presently about 6 inches in the case of Si wafer, and enlargement of the GaAs, sapphire substrate has been further delayed. In addition, since a monocrystal substrate is higher in cost, the cost per chip becomes higher.

Thus, to provide monocrystal growth capable of preparing a device of good quality, there has existed the problem that the kinds of appropriate substrate materials have been limited to a very narrow range.

On the other hand, studies and developments have been abundantly made for three-dimensional integrated circuit for accomplishing high integration and multifunction by laminating semiconductor devices in the direction normal to the substrate. Also, studies and developments have been actively done in recent years regarding large area semiconductor devices such as the solar battery, the switching transistor of liquid crystal picture element, etc. in which devices are arranged in an array on an inexpensive glass.

What is common to both of these products is that it is necessary to have a technique of forming a thin film monocrystal of a semiconductor material on an amorphous insulating material and forming an electronic device such as transistor, etc. thereon. Among them, it has been particularly desired to have a technique of forming a monocrystal semiconductor of high quality on an amorphous insulating material.

Generally speaking, when a thin film is deposited on a substrate of an amorphous insulating material such as $SiO_2$, etc., due to deficiency of long distance order of the substrate material, the deposited film will have a crystalline structure which is amorphous or polycrystalline. Here, the amorphous film is a film in which the short distance order to the extent of the nearest atom may be maintained, but there is no longer distance order. A polycrystalline film is a film in which monocrystal grains having no specific crystal orientation are gathered together as separated through grain boundaries.

For example, when Si monocrystals are to be formed on $SiO_2$ by the CVD method, if the deposition temperature is about 600° C. or lower, they will become amorphous silicon, and at higher temperatures they will be polycrystalline silicons with grain sizes distributed between some hundred to some thousand angstroms. However, the particle sizes of polycrystalline silicon and distribution thereof will vary greatly depending on the method for formation.

Further, by melting and solidifying amorphous or polycrystalline film with an energy beam such as laser, rod-shaped heater, etc., a polycrystalline film with larger grain size of about micron to millimeter has been obtained (monocrystal silicon on non-single-crystal insulators, Journal of Crystal Growth, Vol. 63, No. 3, October, 1983 edited by G. W. Cullen).

On the thin film of the respective crystal structures thus formed, transistors were formed, and from their characteristics, electron mobilities were measured and compared with that of monocrystalline silicon. As the result, the polycrystalline silicon with a large grain size of some tim to some mm obtained by melting solidification is found to have a mobility to the same extent as in the case of monocrystal silicon, while the polycrystalline silicon having a grain size distribution of some hundred to some thousand angstroms is seen to have a mobility which is about $10^{-3}$ of that in the case of monocrystalline silicon. In the case of amorphous silicon, an electron mobility to the extent of about $2 \times 10^{-4}$ of that in the case of monocrystalline silicon is obtained.

From these results, it can be understood that there is a great difference in electrical characteristics between the device formed in the monocrystal domain within crystal grains and the device formed as bridging over the grain boundary. That is, the deposited film on the amorphous material obtained by the prior art method will become an amorphous structure or a polycrystalline structure having a grain size distribution, and the device prepared thereon becomes greatly deteriorated in its performance as compared with the device prepared on the monocrystal layer. For this reason, the uses are limited to simple switching devices, solar battery, photoelectric transducing device, etc.

Also, the method for forming a polycrystalline thin film with greater grain size by melting and solidification has involved the problems such that enormous time is required for enlargement of grain size, that bulk productivity is poor and also that it is not fitted for enlargement of area, because amorphous or monocrystal thin film is scanned with energy beam for every wafer.

As described above, according to the method for forming crystals of the prior art, three-dimensional integration or enlargement of the deposited area could only be done with difficulty, could only be practically applied to devices with difficulty, such that it was impossible to form a monocrystal required for preparation of the device having excellent characteristics, easily and at low cost.

SUMMARY OF THE PRESENT INVENTION

Accordingly, an object of the present invention is to cancel the above problems of the prior art and provide a method for growth of a monocrystal which can be easily three-dimensionally integrated or enlarged in area, easily applied practically for devices and also has excellent characteristics.

Another object of the present invention is to provide a method for growth of a crystal, which comprises arranging primary seeds which are thin enough to be agglomerated and have sufficiently fine area to be agglomerated as single substance on a non-nucleation surface ($S_{NDS}$) having small nucleation density, and causing agglomeration to occur by applying heat treatment to the primary seeds, thereby forming a monocrystalline seed with a controlled face orientation and permitting a monocrystal to grow with the monocrystalline seed as the originating point.

Still another object of the present invention is to provide a method for growth of a crystal, which can form a monocrystal thin film even on a substrate with a large area such as glass, in which an amorphous insulating substrate is used and any substrate having heat resistance to the process temperature in the post-treatment step or higher can be used.

Still another object of the present invention is to provide a method for growth of crystal which, when a fine monocrystal is formed at any desired position on a substrate and crystals are grown until the respective monocrystals grow together, can also control the sizes of the grown monocrystals by the distances between the fine monocrystals.

Still another object of the present invention is to provide a method for growth of crystal, in which a large number of monocrystals which become the seeds have a uniform face orientation, and also a large number of monocrystals grown thereon have a uniform face orientation, with little variance of the characteristics of the single device formed on the monocrystals, which is suitable for integrated devices.

Still another object of the present invention is to provide a method for growth of crystals, which can form a large number of semiconductor monocrystals large enough to enable formation of single devices on an amorphous insulating substrate, and for example, can form by integration monocrystal devices of high performance on a substrate which is inexpensive and has a large area, such as quartz glass.

According to the present invention, there is provided a method for growth of a crystal wherein a monocrystalline seed is arranged on a substrate and a monocrystal is permitted to grow with the seed as the originating point, comprising the step of:

(1) providing a substrate having a surface of smaller nucleation density;

(2) arranging on the surface of the substrate primary seeds having sufficiently fine surface area to be agglomerated;

(3) applying heat treatment to the primary seeds to cause agglomeration to occur, thereby forming a monocrystalline seed with a controlled face orientation; and (4) applying crystal growth treatment to permit a monocrystal to grow with the monocrystalline seed as the originating point.

BRIEF DESCRIPTION OF THE DRAWINGS

FIG. 2(A) to FIG. 3(B) are diagrams for illustration of an embodiment of the present invention, FIG. 2(A) to 2(E) showing diagrams of steps

DESCRIPTION OF THE INVENTION

In the present invention, heat treatment is applied to the primary seeds arranged on a non-nucleation surface as mentioned above to give rise to agglomeration.

More specifically, the present invention utilizes the phenomenon of mono-crystallization of the primary seeds with a uniform face orientation during agglomeration as described above, and arranging monocrystalline seeds with a uniform face orientation on a non-nucleation surface, thereby permitting selective epitaxial growth from the primary seed.

Since the non-nucleation surface has smaller nucleation density as compared with the surface of seed, no nucleation and crystal growth will occur from this surface, and crystal growth occurs selectively from the fine agglomerated product which is monocrystalline seed.

The thickness of the primary seed arranged on the non-nucleation surface is thin enough to afford agglomeration when heat treatment as described below is applied. For example, a thickness of 0.1 μm or less is preferred, more preferably 0.06 μm or less.

Hereinafter, this film is called ultra-thin film.

Also, the above primary seeds may have an area fine enough to be agglomerated as a single substance. For example, the diameter may be preferably 7 μm or less, more preferably 2 μm or less, optimally 1 μm or less.

When heat treatment is applied to the above primary seeds at a temperature of melting point or lower, agglomeration phenomenon occurs as if in a liquid phase, whereby the ultra-thin film becomes an agglomerated product. And, its specific feature resides in that the agglomerated product is monocrystalline and becomes monocrystals with uniform face orientation having a constant face orientation.

As the material for the primary seed of the present invention, any material with significantly larger surface area ratio relative to volume, consequently making the surface energy a minimum and with reduction of surface energy as the driving force. Such materials permit migration of atoms even in the solid phase and cause the agglomeration phenomenon to occur at a temperature lower by far than the melting point.

As the optimum material, there may be included metals such as Ge, Si, Cu, Ag, Au, Pt, Pd, etc. or alloys such as PtSi, InSn, etc.

The temperature at which primary seeds are subjected to heat treatment is related to the material and the film thickness, etc. of the primary seeds, but may be the melting point or lower, and the agglomeration initiation temperature or higher. For example, when the material of ultra-thin film is Ge, heat treatment may be applied at the agglomeration initiation temperature (600° C.) or higher and the melting point (973° C.) or lower.

Figure 1:
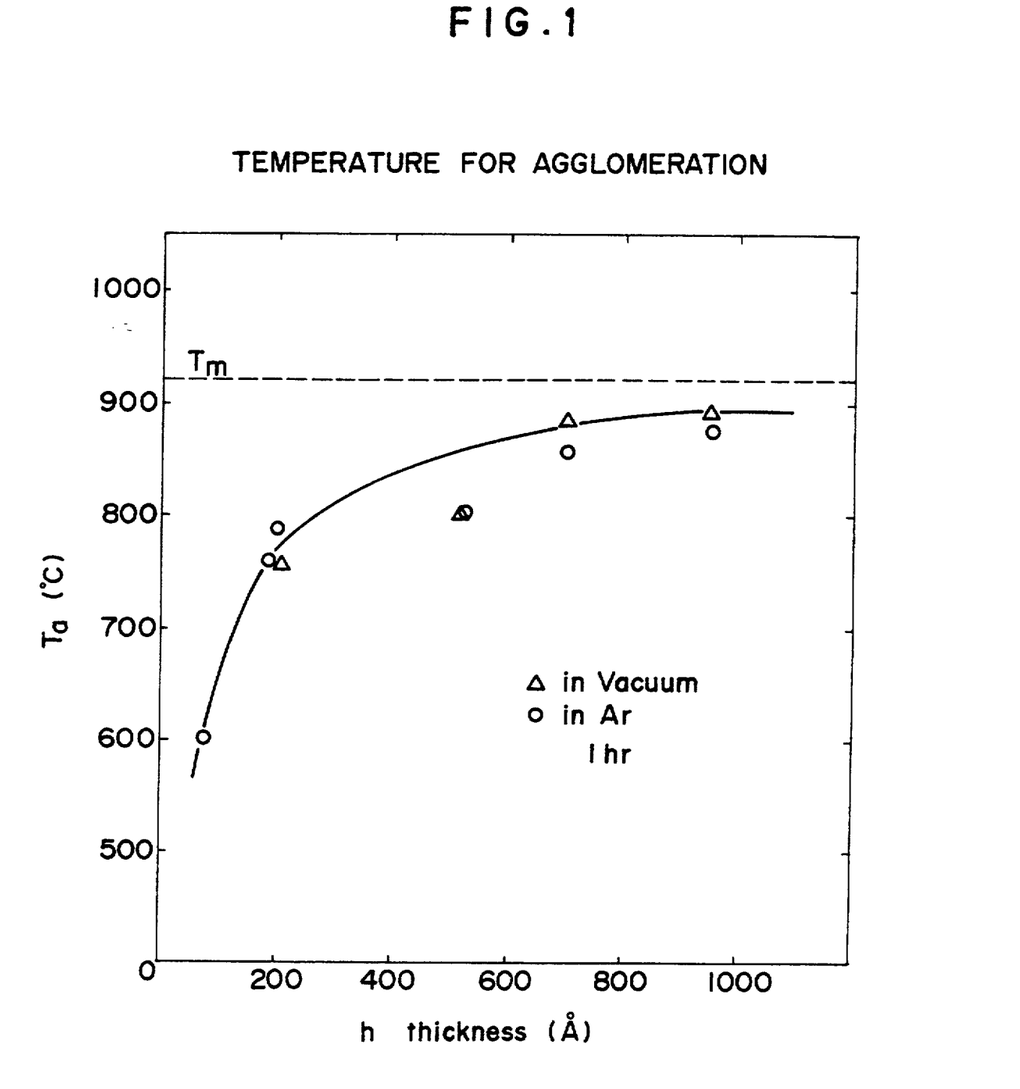
FIG. 1 is a graph showing the relationship between film thickness and agglomerating temperature of Ge concerning agglomeration of ultra-thin film.

As can be seen from FIG. 1, the agglomeration temperature will be lowered with reduction in film thickness of the thin film. In the case of Ge film, as shown in FIG. 1, agglomeration begins at lower than the melting point (937° C.), and when the film thickness becomes 150 Å, the agglomeration initiation temperature is lowered even to 600° C. In the case of continuous film, when a Ge thin film of 200 Å is formed on glass, quartz, $SiO_2$ such as thermally oxidized film, CVD film, etc. and heat treated at 700° C. for one hour, holes are formed on the film as the preceding stage to disruption.

When heat treatment is applied at 750° C. for the same time, the continuous film will be disrupted in the solid phase to become undesirably beads of some 1000 Å.

On the other hand, as the material to be grown, Ge, Si, GaAs, GaAlAs, etc. may be employed. That is, either homoepitaxial growth or heteroepitaxial growth can be practiced.

For the method for crystal growth treatment, a suitable deposition method such as the CVD method, the liquid phase growth method, etc. may be employed.

EXAMPLE 1

Figure 2A:
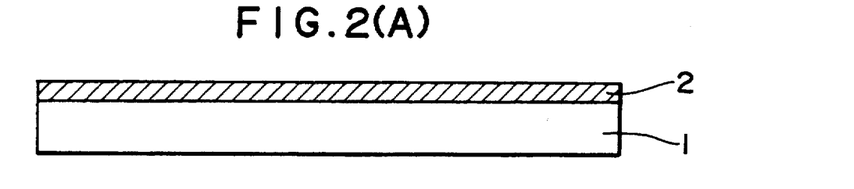

Example 1 is described below by referring to FIG. 2 and FIG. 3. On a silicon wafer substrate 1 having a $SiO_2$ layer deposited by the normal pressure CVD method (substrate temperature 400° C.), a ultra-thin film comprising Ge with a film thickness of 200 Å was deposited according to the RF sputtering method at a substrate temperature of 600° C. (FIG. 2(A)).

The above ultra-thin film was found to be polycrystalline, and the face orientation vertical to the substrate 1 was <100>.

Figure 2B:
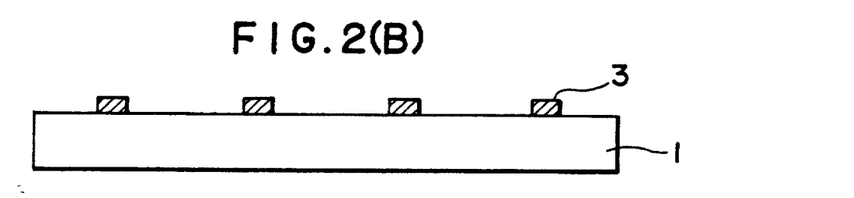
Figure 3A:
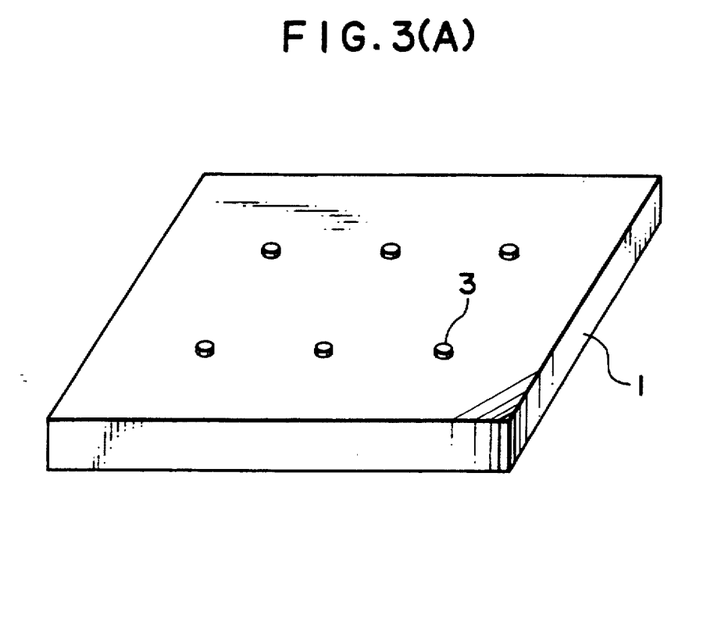
FIG. 3(A) and FIG. 3(B) are perspective views.
Figure 3B:
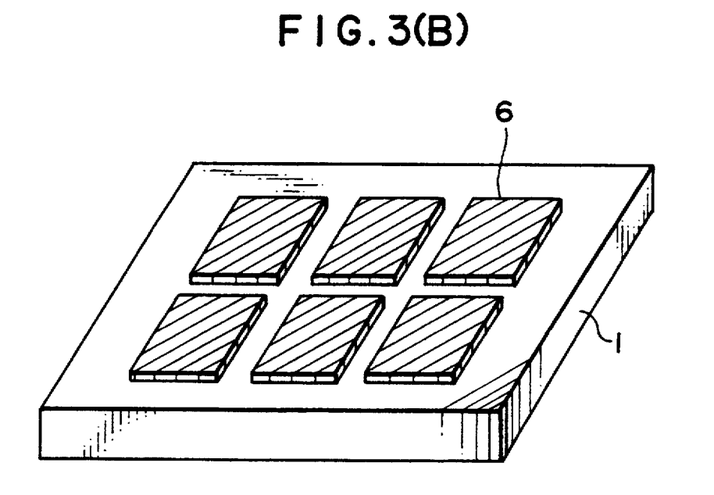

Next, patterning was effected with 2 μm square at 50 μm intervals (FIG. 2(B)) to form primary seeds. As the patterning method, photolithography and the reactive etching were employed.

Next, in Ar atmosphere, heat treatment was conducted at 750° C. for one hour. By carrying out such heat treatment, the primary seeds were caused to effect agglomeration phenomenon as if they were in liquid phase to give an agglomerated product (FIG. 2(C)).

Figure 2C:
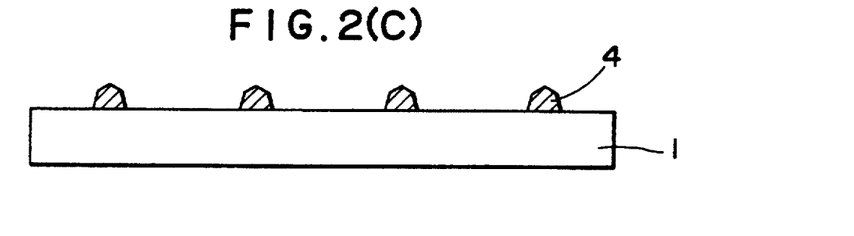

From observation by a transmission electron microscope, it was confirmed that each Ge agglomerated product is a monocrystal having internally no grain boundary and the face orientation in the direction vertical to the substrate 1 was uniformly oriented to <100>. Thus, the agglomerated product becomes a monocrystal seed which maintains the face orientation observed before the heat treatment.

Then, with the above agglomerated product as the seed, heteroepitaxial growth of Si was performed by the CVD method. The growth conditions were as follows:
temperature: 950° C.
source gas: $SiH_2Cl_2$ 0.6 slm
etching gas: HCl 1.5 slm
carrier gas: $H_2$ 100 slm
pressure: 150 Torr.

Figure 2D:
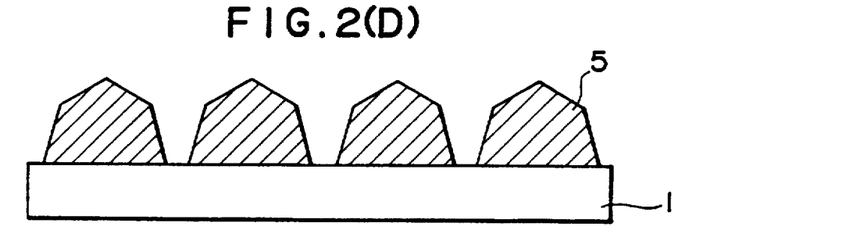

When the above growth was conducted for 30 minutes, growth proceeded from the seed onto the $SiO_2$ layer which was the non-nucleation surface, whereby monocrystals having sizes as large as 40 to 50 μm (hereinafter called "crystal islands") were grown (FIG. 2(D)).

As the result of X-ray diffraction narrowed to 30 μmφ of each crystal island in a micro-portion X-ray diffraction device, all the face orientations vertical to the substrate 1 were confirmed to be oriented in the <100> direction. Thus, it can be understood that growth occurred with the direction of the Ge seed crystal being succeeded.

Figure 2E:
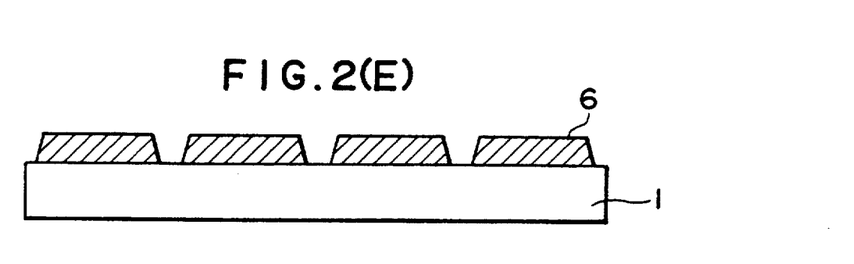

After the crystal island was flattened by lap and polishing (FIG. 2(E)), P-channel MOSFET was prepared thereon and its characteristics were examined. As the result, it was found to actuate similarly as that prepared on monocrystalline Si (100) wafer, with the mobility of positive hole being 190 $cm^2/v.sec$ and leak current $10^{-12}$ Å/μm, thus exhibiting good characteristics.

EXAMPLE 2

In this Example, Si monocrystal was heteroepitaxially grown on a monocrystal seed in the same manner as in Example 1 except for using a substrate having $Al_2O_3$ surface.

By performing the above growth, the face orientation vertical to the substrate 1 was found to be oriented in the <100> direction similarly as in the case of Example 1, whereby crystal islands with sizes of 40 to 50 μm were grown.

On the above crystal island was prepared P-channel MOSFET similarly as in Example 1, and its characteristics were examined. As the result, it was found to actuate similarly as that prepared on monocrystal silicon wafer (100), with the mobility of positive hole being 190 $cm^2/v.sec$ and the leak current $10^{-12}$ Å/μm.

EXAMPLE 3

In this Example, according to the same method as in Example 1, an agglomerated product of Ge was formed to provide a monocrystal seed.

GaAs was grown according to the MOCVD method under the condition shown below. When crystal growth of GaAs was effected onto the monocrystal seed comprising an agglomerated product of Ge, with the substrate temperature being 670° C., the source gases being 50 sccm of arsine ($AsH_3$) and 2 sccm of trimethylgallium (TMG) and He being 30 slm as the carrier gas, GaAs monocrystal islands with diameter of about 40 μm were grown in 80 minutes, which were confirmed to be identical in direction with Ge monocrystal by micro-portion X-ray diffraction.

Under the growth condition no nucleation of GaAs occurred on $SiO_2$, but it was grown only on monocrystal Ge to cover over $SiO_2$.

EXAMPLE 4

In this Example, a monocrystal seed comprising an agglomerated product of Ge was formed similarly as in Example 1, and then Si monocrystal was grown from liquid phase on the seed.

Si monocrystal was grown by melting Si with Sn solvent at a cooling initiation temperature of 900° C. The cooling speed was 0.2° C./min. According to this method, a complete monocrystal was grown flatly in the lateral direction onto $SiO_2$, and yet it was also possible to grow monocrystal islands with an uniform face orientation similarly as the CVD method. Also, regular orientations were confirmed by micro-portion X-ray diffraction.

When a device was prepared on the crystal island formed in this Example similarly as in Example 1, it did actuate similarly as that prepared on a monocrystal Si (100) wafer.

EXAMPLE 5

In this Example, a monocrystal seed comprising an agglomerated product of Ge was formed similarly as in Example 4 except for making the intervals of patterning 100 μm, and then GaAs was grown from liquid phase.

Crystal growth of GaAs monocrystal was perfomed by use of Ga solvent with a cooling temperature of 0.7° C./min. and a cooling initiation temperature of 750° C. Within 15 minutes, large size monocrystal islands of about 70 to 100 μm were grown, and yet regular orientations were confirmed by micro-portion X-ray diffraction.

On the crystal island formed in this Example was prepared P-channel MOSFET similarly as in Example 1, and its characteristics were examined. As the result, it was formed to actuate similarly as that formed on monocrystal Si (100) wafer.

EXAMPLE 6

On a $SiO_2$ glass substrate, a polycrystalline silicon film with a thickness of 250 Å was formed by the LPCVD method.

Subsequently, the above polycrystalline silicon film was subjected to patterning to 0.4 μm square and 50 μm interval by photolithography and reactive etching to form primary seeds.

Next, the above primary seeds were annealed in hydrogen atmosphere at normal pressure at 1000° C. for 2 minutes to obtain monocrystalline seeds comprising an agglomerated product of silicon.

From observation by a transmission electron microscope, the respective silicon agglomerated products were found to be monocrystals having internally no grain boundary.

Subsequently, with the above agglomerated product as the seed, epitaxial growth of Si was performed by the CVD method under the following conditions:
substrate temperature: 1000° C.
amounts of gases introduced:
  $SiH_2Cl_2$: 0.53 slm
  HCl: 1.8 slm
  $H_2$: 100 slm
pressure: 150 Torr When growth was performed under the above conditions for 30 minutes, the silicon monocrystal was epitaxially grown beyond the above seed crystal onto the $SiO_2$ glass substrate which is the non-nucleation surface, and its grain size was 45 to 50 μm.

EXAMPLE 7

On a quartz substrate, a polycrystalline silicon ultra-thin film with a thickness of 1000 Å was formed by the LPCVD method.

Subsequently, the above polycrystalline silicon ultra-thin film was subjected to patterning 1.2 μm square and 60 μm interval by photolithography and reactive etching to form primary seeds.

Next, the above primary seeds were annealed in hydrogen atmosphere at normal pressure at 1010° C. for 3 minutes to form an agglomerated product of silicon.

From observation by a transmission electron microscope, the respective agglomerated silicon products were found to be monocrystals having no grain boundary.

Subsequently, with the above agglomerated product as the monocrystal seed, epitaxial growth of Si was conducted by the CVD method under the same conditions as in Example 6 for 30 minutes.

The crystals obtained were epitaxially grown beyond the seed crystals onto the quartz substrate which is the non-nucleation surface, with its grain size being 57 to 60 μm, and monocrystals with regular grain sizes could be obtained with good yield on the respective seed monocrystals.

We claim:

1. A method for crystal growth wherein monocrystalline seeds are arranged on a substrate and a monocrystal is permitted to grow with the seed as the originating point, comprising the steps of:
   (a) providing a substrate having a surface of smaller nucleation density;
   (b) arranging on the surface of the substrate a plurality of amorphous or polycrystalline primary seeds each having a thickness no greater than 0.1 μm, a diameter of 7 μm or less and sufficiently fine surface area to be agglomerated to form a single agglomerated product at a desired position on said substrate;
   (c) applying heat treatment to said plurality of primary seeds to cause agglomeration to occur, thereby forming single monocrystalline seeds with a controlled face orientation; and
   (d) applying crystal growth treatment selected from vapor deposition and liquid phase growth to permit monocrystals to grow with monocrystalline seeds as originating points.

2. The method according to claim 1, wherein the surface of smaller nucleation density is an amorphous insulating film.

3. The method according to claim 1, wherein the temperature of the heating treatment is equal to or lower than the melting point of the material constituting the seeds.

4. The method according to claim 2, wherein the temperature of the heating treatment is equal to or lower than the melting point of the material constituting the seeds.

5. The method according to claim 1, wherein the temperature of the heating treatment is equal to or lower than the melting point of the material constituting the seeds.

6. The method according to claim 1, wherein the heat treatment of the material constituting the seeds is carried out in hydrogen atmosphere.

7. The method according to claim 1, wherein the material of the primary seeds is selected from among germanium, silicon, copper, silver, platinum, gold, palladium, Pt-Si alloy and In-Sn alloy.

8. A method for crystal growth wherein monocrystalline seeds are arranged on a substrate and a monocrystal is permitted to grow with the seed as the originating point, comprising the steps of:
   (a) providing a substrate of an insulating material and having a surface of smaller nucleation density;

(b) arranging on the surface of the substrate a plurality of amorphous or polycrystalline primary seeds of a semiconductor material having a thickness no greater than 0.1 μm, a diameter of 7 μm or less and sufficiently fine surface area to be agglomerated to form a single agglomerated product at a desired position on said substrate;

(c) applying heat treatment to said plurality of primary seeds in an atmosphere containing hydrogen gas at a temperature lower than the melting point of a primary seed to cause agglomeration to occur, thereby forming single monocrystalline seeds with a controlled face orientation; and (d) applying crystal growth treatment selected from vapor deposition and liquid phase growth to permit monocrystals to grow with monocrystalline seeds as originating points.

9. The method according to claim 1, wherein the nucleation density of said substrate surface is smaller than the nucleation density of a surface of said primary seeds.

10. The method according to claim 8, wherein the nucleation density of said substrate surface is smaller than the nucleation density of a surface of said primary seeds.

* * * * *

UNITED STATES PATENT AND TRADEMARK OFFICE
CERTIFICATE OF CORRECTION

PATENT NO. : 5,363,799

DATED : November 15, 1994

INVENTOR(S) : TAKAO YONEHARA, ET AL.

It is certified that error appears in the above-identified patent and that said Letters Patent is hereby corrected as shown below: TITLE PAGE:

[56] References Cited

U.S. PATENT DOCUMENTS, insert

--4,551,394 11/85 Betsche et al. ... 357/17;
4,587,717 5/86 Daniele et al. ... 437/129;
4,467,521 8/87 Spooner et al. ... 156/612;
4,549,926 10/85 Corboy et al. ... 156/612;
3,888,061 5/75 Corboy et al. ... 437/81;
4,479,847 11/84 Mc Caldin et al. ... 156/624;
4,470,192 9/84 Miller ... 156/612;
4,131,496 12/78 Weitzel et al. ... 156/613;
4,279,688 7/81 Abrahams et al. ... 156/613;
4,174,422 11/79 Matthews, deceased, et al. ... 428/621;
3,764,409 10/73 Nomura et al. ... 437/90;
4,530,149 7/85 Jastrzebski et al. ... 437/90;
4,670,088 6/87 Tsaur et al. ... 437/89;
4,727,047 2/88 Bozler et al. ... 437/89;
4,749,441 6/88 Christenson et al. ... 437/90;
4,657,603 4/87 Kruehler et al. ... 148/175;
4,216,037 8/80 Katoda et al. ... 148/175; and
4,052,782 10/77 Weinstein et al. ... 29/572--.

FOREIGN PATENT DOCUMENTS, insert

--0244081 11/87 Europe ...156/613; and
0028327 2/84 Japan ... 156/613--.

OTHER PUBLICATIONS, insert

--Chen et al., "Embedded Epitaxial Growth...", App. Phys. Lett. 38(5), 1981, pp.301-303; and

UNITED STATES PATENT AND TRADEMARK OFFICE
CERTIFICATE OF CORRECTION

PATENT NO. : 5,363,799
DATED : November 15, 1994
INVENTOR(S) : TAKAO YONEHARA, ET AL.

It is certified that error appears in the above-identified patent and that said Letters Patent is hereby corrected as shown below:

OTHER PUBLICATIONS, Cont'd.

Filby et al., "Single-Crystal Films of Silicon on Insulators", British Journ. Appl. Phys., Vol. 18, No. 10, 1967, pp. 1357-1382.--

COLUMN 1

Line 64, "circuit" should read --circuits--; and
    Line 65, "function" should read --functions--.

COLUMN 2

Line 44, "tim" should read --$\mu$m--.

COLUMN 3

Line 68, "step" should read --steps--.

COLUMN 4

Line 62, "force." should read --force, is used.--.

COLUMN 5

Line 37, "a" should read --an--; and
    Line 68, "150 Tort." should read --150 Tou.--.

COLUMN 7

Line 1, "an" should read --a--.

UNITED STATES PATENT AND TRADEMARK OFFICE
CERTIFICATE OF CORRECTION

PATENT NO. : 5,363,799
DATED : November 15, 1994
INVENTOR(S) : TAKAO YONEHARA, ET AL.

It is certified that error appears in the above-identified patent and that said Letters Patent is hereby corrected as shown below:

<u>COLUMN 8</u>

Lines 20, 21, "a monocrystal is" should read --monocrystals are--;
    Line 21, "seed" should read --seeds--;
    Line 22, "point" should read --points--;
    Line 39, "Originating" should read --the originating--;

Lines 64-65, "a monocrystal is" should read --monocrystals are--;
    Line 65, "seed" should read --seeds--; and
    Line 66, "point" should read --points--.

Signed and Sealed this

Fourth Day of July, 1995

BRUCE LEHMAN

*Attest:*

*Attesting Officer*       *Commissioner of Patents and Trademarks*